United States Patent
Noda et al.

(10) Patent No.: US 10,727,026 B2
(45) Date of Patent: Jul. 28, 2020

(54) CHARGED PARTICLE BEAM INSPECTION METHOD

(71) Applicant: NuFlare Technology, Inc., Yokohama-shi (JP)

(72) Inventors: Chosaku Noda, Yokohama (JP); Riki Ogawa, Kawasaki (JP)

(73) Assignee: NuFlare Technology, Inc., Yokohama-shi (JP)

(*) Notice: Subject to any disclaimer, the term of this patent is extended or adjusted under 35 U.S.C. 154(b) by 0 days.

(21) Appl. No.: 16/253,510

(22) Filed: Jan. 22, 2019

(65) Prior Publication Data

US 2019/0259572 A1 Aug. 22, 2019

(30) Foreign Application Priority Data

Feb. 21, 2018 (JP) .................................. 2018-028553

(51) Int. Cl.
*H01J 37/28* (2006.01)
*H01J 37/147* (2006.01)
*H01J 37/063* (2006.01)

(52) U.S. Cl.
CPC ............ *H01J 37/28* (2013.01); *H01J 37/063* (2013.01); *H01J 37/1474* (2013.01)

(58) Field of Classification Search
CPC ...... H01J 37/063; H01J 37/1474; H01J 37/28; H01J 37/3023; H01J 37/3026
See application file for complete search history.

(56) References Cited

U.S. PATENT DOCUMENTS

| | | | | |
|---|---|---|---|---|
| 5,892,224 A | * | 4/1999 | Nakasuji | G01N 23/225 250/307 |
| 7,391,033 B1 | * | 6/2008 | Adler | B82Y 10/00 250/398 |
| 9,536,702 B2 | * | 1/2017 | Lang | H01J 37/222 |
| 2005/0279936 A1 | * | 12/2005 | Litman | G01N 23/225 250/310 |

(Continued)

FOREIGN PATENT DOCUMENTS

| CN | 105453242 A | 3/2016 |
|---|---|---|
| CN | 105765691 A | 7/2016 |

(Continued)

OTHER PUBLICATIONS

Office Action dated Mar. 9, 2020, in Taiwanese Patent Application No. 108102939 (with English-language translation).

(Continued)

*Primary Examiner* — David E Smith
(74) *Attorney, Agent, or Firm* — Oblon, McClelland, Maier & Neustadt, L.L.P.

(57) ABSTRACT

A charged particle beam inspection method conducted by disposing a sample on a stage and by performing a first scanning in a first beam scanning area on the sample by using one first charged particle beam out of a plurality of charged particle beams while the stage is moved so that a first inspection of a first inspection unit in the first beam scanning area is performed, and by performing a second scanning in a second beam scanning area on the sample by using one second charged particle beam out of the charged particle beams while the stage is moved so that a second inspection of a second inspection unit in the second beam scanning area is performed.

18 Claims, 8 Drawing Sheets

(56) References Cited

U.S. PATENT DOCUMENTS

2017/0011883 A1* 1/2017 Lev ................. H01J 37/265
2017/0117114 A1* 4/2017 Zeidler .............. H01J 37/28

FOREIGN PATENT DOCUMENTS

| JP | 2017-090063 | 5/2017 |
| JP | 2018-17571 | 2/2018 |
| KR | 10-2019-0019009 | 4/2020 |

OTHER PUBLICATIONS

Office Action dated Apr. 27, 2020, in Korean Patent Application No. 10-2019-0019009, w/Machine English Translation.

* cited by examiner

CHARGED PARTICLE BEAM INSPECTION METHOD

CROSS-REFERENCE TO RELATED APPLICATION

This application is based upon and claims the benefit of priority from Japanese Patent Applications No. 2018-028553, filed on Feb. 21, 2018, the entire contents of which are incorporated herein by reference.

FIELD OF THE INVENTION

Embodiments described herein relate generally to a charged particle beam inspection method.

BACKGROUND OF THE INVENTION

In recent years, the circuit line width required for semiconductor devices has been getting narrower with the increase in the degree of integration and capacity of large scale integrated circuits (LSI). These semiconductor devices are manufactured by using an original image pattern (also referred to as a mask or a reticle, and hereinafter referred to as a mask) on which a circuit pattern is formed and by exposing and transferring the pattern onto a wafer using a reduced projection exposure apparatus which is a so-called stepper to form a circuit.

And now, improvement of yield is indispensable for manufacturing LSTs requiring a large manufacturing cost. However, as represented by 1 gigabit class dynamic random access memory (DRAM), patterns constituting the LSI are now on the order of submicrons to nanometers. In recent years, with the miniaturization of dimensions of the LSI pattern formed on a semiconductor wafer, the dimension of a pattern defect to be detected is extremely small. Therefore, higher accuracy of a pattern inspection apparatus is required for inspecting defects of ultrafine patterns transferred onto a semiconductor wafer. Besides, as one of the major factors for lowering the yield, pattern defects of a mask used for exposing and transferring an ultrafine pattern on a semiconductor wafer by a photolithography technique can be mentioned. Accordingly, the accuracy of the pattern inspection apparatus for inspecting defects of the transfer mask used for LSI manufacturing needs to be improved.

As an inspection method, a method of performing an inspection by comparing an optical image obtained by capturing an image of a pattern formed on a sample such as a semiconductor wafer or a lithography mask at a predetermined magnification by using an enlarging optical system with design data or an optical image obtained by capturing an image of the same pattern on a sample is known. For example, as a pattern inspection method, there are a "die to die inspection" of comparing optical image data obtained by capturing images of identical patterns at different places on the same mask each other, and a "die to database inspection" in which drawing data (design pattern data) converted into a device input format to be input by a drawing apparatus at the time of drawing the pattern using CAD data of designed pattern as a mask is input to an inspection apparatus, and design image data (reference image) is generated on the basis of the drawing data, and then the design image data is compared with an optical image obtained by capturing an image of the pattern as measurement data. In the inspection method in such an inspection apparatus, the inspection object substrate is disposed on a stage, and the sample is scanned with the light flux by the movement of the stage, and the inspection is performed. The inspection object substrate is irradiated with a light flux by a light source and an illumination optical system. Light transmitted through or reflected from the inspection object substrate forms an image on the sensor via the optical system. The image captured by the sensor is sent as measurement data to the comparison circuit. In the comparison circuit, after the images are aligned with each other, the measurement data and the reference data are compared according to an appropriate algorithm, and when both of the data do not agree with each other, presence of a pattern defect is determined.

The above-described pattern inspection apparatus acquires an optical image by irradiating an inspection object substrate with a laser beam and capturing a transmission image or a reflection image of the substrate. On the other hand, an inspection apparatus has been developed, which irradiates the inspection object substrate with multi-beams composed of a plurality of electron beams in an array arrangement in which a plurality of rows of beams aligned at the same pitch on a straight line are arranged, and detects secondary electrons corresponding to the respective beams emitted from inspection object substrate to obtain a pattern image. In a pattern inspection apparatus using an electron beam including such multi-beams, secondary electrons are detected by scanning each small area of the inspection object substrate. At this time, the so-called step-and-repeat operation is carried out in which the position of the inspection object substrate is fixed during scanning with a beam, and the position of the inspection object substrate is moved to the next small area after scanning is completed. Since multiple beams can be arranged within a limited area by using multi-beams of array arrangement including a plurality of rows of beam lines each having beams disposed at the same pitch on a straight line, scanning of many small areas can be done at the same time. Therefore, improvement of throughput is expected. However, the settling time (overhead time) until the stage position is stabilized is required for every stage movement in the step-and-repeat operation. Since one scanning range (small area) is small, the number of steps of the stage is enormous in order to scan the entire substrate. Accordingly, time calculated by multiplying the step number by the settling time is generated as unnecessary time not required for scanning. Even when scanning is carried out on the substrate by using multi-beams, there is also a provisional estimate indicating that an unused period of time for scanning generated for one substrate comes up to 80 hours or more, for example.

SUMMARY OF THE INVENTION

A charged particle beam inspection method according to an embodiment of the present disclosure is a method conducted by disposing a sample on a stage and by performing a first scanning in a first beam scanning area on the sample by using one first charged particle beam out of a plurality of charged particle beams while the stage is moved so that a first inspection of a first inspection unit in the first beam scanning area is performed, and by performing a second scanning in a second beam scanning area on the sample by using one second charged particle beam out of the charged particle beams while the stage is moved so that a second inspection of a second inspection unit in the second beam scanning area is performed.

DETAILED DESCRIPTION OF THE EMBODIMENTS

Hereinafter, embodiments of the present disclosure will be described with reference to the drawings.

Hereinafter, in the embodiment, a case where an electron beam is used as an example of a charged particle beam will be described. However, the embodiment is not limited to this. Other charged particle beams such as an ion beam may be used.

First Embodiment

According to a charged particle beam inspection method of an embodiment of the present disclosure, a sample is disposed on a stage and a first scanning is performed in a first beam scanning area on the sample by using one first charged particle beam out of a plurality of charged particle beams while the stage is moved so that a first inspection of a first inspection unit in the first beam scanning area is performed, and a second scanning is performed in a second beam scanning area on the sample by using one second charged particle beam out of the charged particle beams while the stage is moved so that a second inspection of a second inspection unit in the second beam scanning area is performed.

Figure 1:
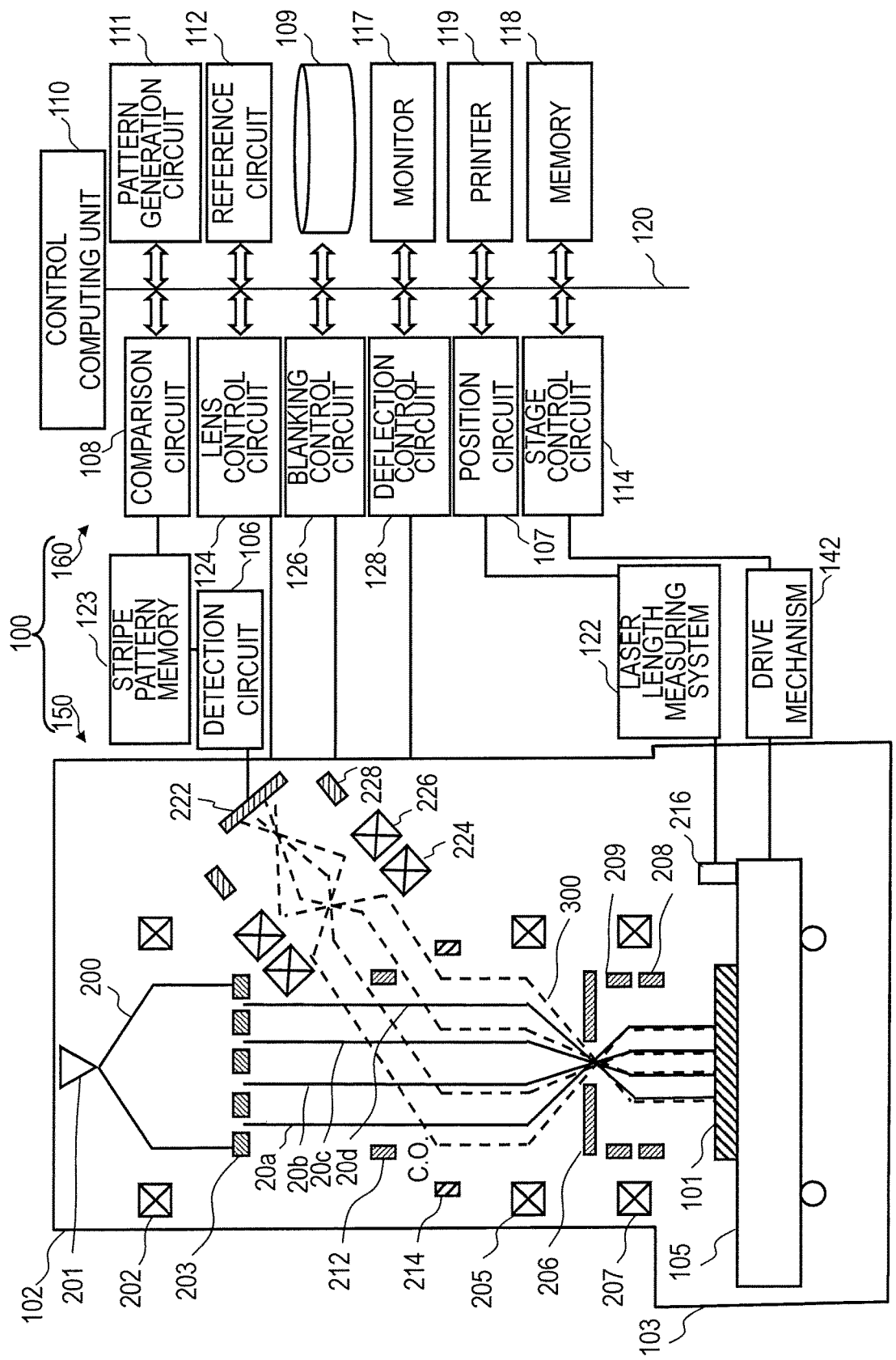
FIG. 1 is a configuration diagram showing a configuration of a pattern inspection apparatus according to a first embodiment.

FIG. 1 is a configuration diagram showing a configuration of a pattern inspection apparatus according to the first embodiment. In FIG. 1, an inspection apparatus 100 for inspecting a pattern formed on a substrate is an example of a charged particle beam inspection apparatus. The inspection apparatus 100 includes an electronic optical image acquisition mechanism 150 and a control system circuit 160 (control unit). The electronic optical image acquisition mechanism 150 includes an electron beam column 102 (electron lens barrel), an inspection chamber 103, a detection circuit 106, a stripe pattern memory 123, a stage drive mechanism 142, and a laser length measuring system 122. In the electron beam column 102, an electron gun 201, an illumination lens 202, a shaping aperture array substrate 203, a reduction lens 205, a restricting aperture substrate 206, an objective lens 207, a main deflector 208, a sub deflector 209, a collective blanking deflector 212, a beam separator 214, projection lenses 224 and 226, a deflector 228, and a multi-detector 222 are disposed.

In the inspection chamber 103, an XY stage (an example of a stage) 105 movable at least on the XY plane is disposed. On the XY stage 105, a sample 101 on which a chip pattern to be inspected is formed is disposed. The sample 101 includes a semiconductor substrate such as a mask for exposure and a silicon wafer. For example, the sample 101 is disposed on the XY stage 105 with the pattern formation surface facing upward. Further, on the XY stage 105, a mirror 216 is disposed for reflecting the laser beam for laser length measurement emitted from the laser length measuring system 122 disposed outside the inspection chamber 103. The multi-detector 222 is connected to the detection circuit 106 outside the electron beam column 102. The detection circuit 106 is connected to the stripe pattern memory 123.

In the control system circuit 160, a control computing unit 110 which is a computer is connected to a position circuit 107, comparison circuit 108, pattern generation circuit 111, reference circuit 112, stage control circuit 114, lens control circuit 124, blanking control circuit 126, deflection control circuit 128, storage device 109 such as a magnetic disk device, monitor 117, memory 118, and printer 119 through a bus 120. Further, the stripe pattern memory 123 is connected to the comparison circuit 108. Further, the XY stage 105 is driven by the drive mechanism 142 under the control of the stage control circuit 114. In the drive mechanism 142, for example, a drive system such as a three-axis (X-Y-θ) motor for driving in the X direction, Y direction, and θ direction is configured, and the XY stage 105 is movable. Step motors can be used for these X motors, Y motors, and θ motors (not shown), for example. The XY stage 105 is movable in the horizontal direction and the rotation direction by motors having X, Y, and θ axes, respectively. The moving position of the XY stage 105 is measured by the laser length measuring system 122 and supplied to the position circuit 107. The laser length measuring system 122 measures the position of the XY stage 105 by the principle of the laser interference method by receiving the reflected light from the mirror 216.

A high voltage power supply circuit (not shown) is connected to the electron gun 201, and the electron group emitted from the cathode is accelerated to be emitted as an electron beam by application of a predetermined voltage to an extraction electrode and heating to the cathode (filament) to a predetermined temperature, in addition to application of an acceleration voltage between a filament and an extraction electrode (not shown) in the electron gun 201 from the high voltage power supply circuit. For example, electromagnetic lenses are used for the illumination lens 202, reduction lens 205, objective lens 207, and projection lenses 224 and 226, and all of the lenses are controlled by the lens control circuit 124. The beam separator 214 is also controlled by the lens control circuit 124. The collective blanking deflector 212 and the deflector 228 are constituted by electrode groups of at least two poles, respectively and are controlled by the blanking control circuit 126. The main deflector 208 and the sub deflector 209 are constituted by electrode groups of at least four poles, respectively, and are controlled by the deflection control circuit 128.

When the sample 101 is a semiconductor wafer on which a plurality of chip (die) patterns are formed, pattern data of such a chip (die) pattern is inputted from the outside of the inspection apparatus 100 and stored in the storage device 109. When the sample 101 is a mask for exposure, design pattern data as a basis for forming a mask pattern on the mask for exposure is input from the outside of the inspection apparatus 100 and stored in the storage device 109.

Here, in FIG. 1, necessary configurations for describing the first embodiment are illustrated. The inspection apparatus 100 may usually have other necessary configurations.

Figure 2:
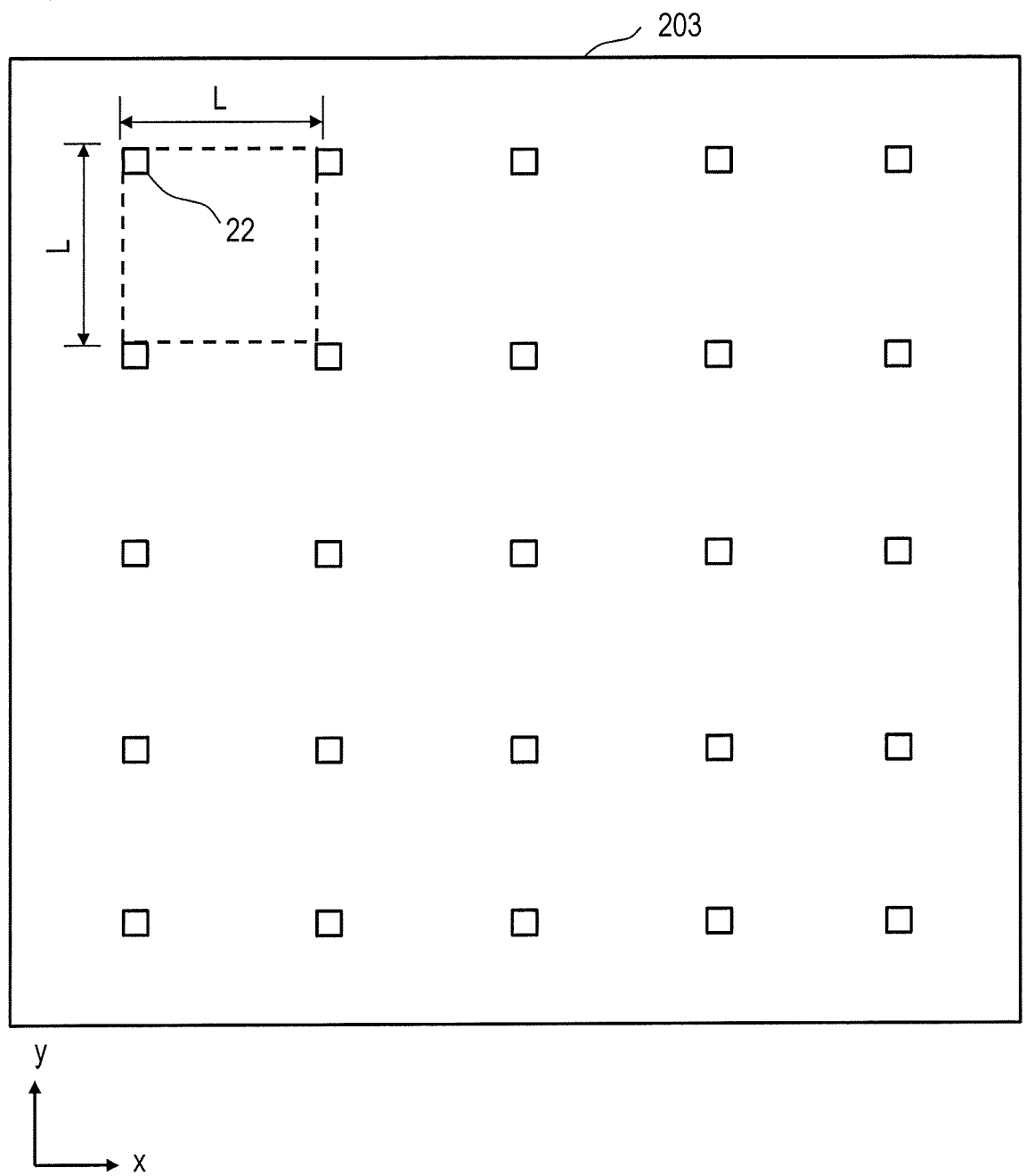
FIG. 2 is a conceptual diagram showing a configuration of a shaping aperture array member according to the first embodiment.

FIG. 2 is a conceptual diagram showing the configuration of the shaping aperture array member according to the first embodiment. In FIG. 2, the shaping aperture array substrate 203 is provided with holes (openings) 22 which are arranged two-dimensionally (in a matrix) so that holes in a N (X direction)-by-N' (y direction) matrix (N is an integer of two or more, and N' is an integer of one or more) are formed at a predetermined arrangement pitch L in the x and y directions (x: first direction, y: second direction). When the reduction magnification of the multi-beams is a (when the sample 101 is irradiated with the multi-beam diameter reduced to 1/a), and the inter-beam pitch of the multi-beams in the x and y directions on the sample 101 is p, the arrangement pitch L satisfies the relationship L=(a×p). In the example of FIG. 2, holes 22 for 5×5 multi-beam formation (N=5 and N'=5) are formed. Next, the operation of the electronic optical image acquisition mechanism 150 in the inspection apparatus 100 will be described.

Figure 3:
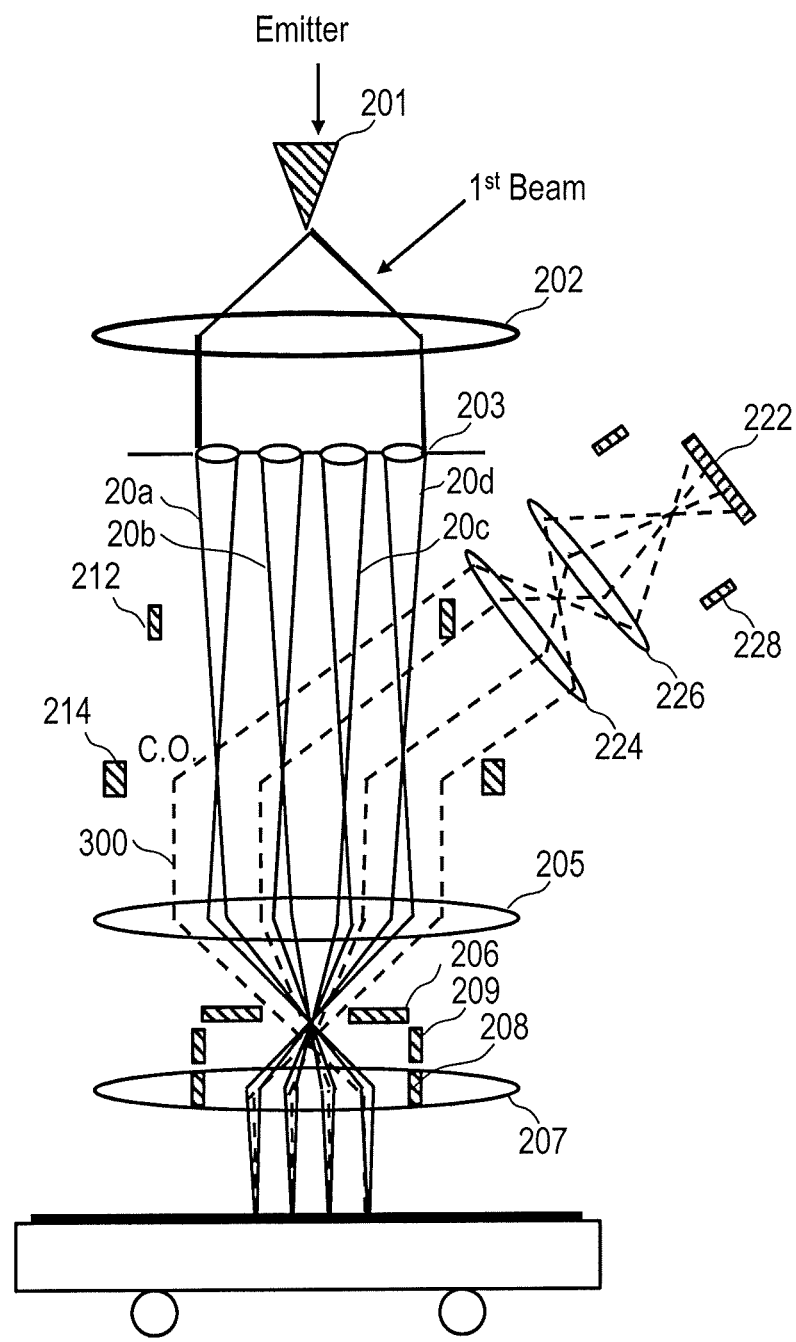
FIG. 3 is a diagram for illustrating a beam trajectory in the inspection apparatus according to the first embodiment.

FIG. 3 is a diagram for illustrating a beam trajectory in the inspection apparatus according to the first embodiment. An electron beam 200 emitted from the electron gun 201 (emission source) illuminates the entire shaping aperture array substrate 203 from the substantially vertical direction by the illumination lens 202. As shown in FIG. 2, a plurality of rectangular holes 22 (openings) are formed in the shaping aperture array substrate 203, and the electron beam 200 illuminates an area including all of the holes 22. Parts of the electron beam 200 emitted to the positions of the holes 22 pass through the holes 22 of the shaping aperture array substrate 203, respectively, so that a plurality of rectangular or circular shaped electron beams (multi-beams) (a plurality of electron beams) 20a to 20d (solid lines in FIGS. 1 and 3), for example, are formed.

The formed multi-beams 20a to 20d subsequently form a crossover (C.O.), pass through the beam separator 214 disposed at the crossover position of the multi-beams 20, and is reduced by the reduction lens 205 to advance toward a center hole formed in the restricting aperture substrate 206. Here, when the entire multi-beams 20a to 20d are collectively deflected by the collective blanking deflector 212 disposed between the shaping aperture array substrate 203 and the reduction lens 205, multi-beams deviate from the hole at the center of the restricting aperture substrate 206 and is shielded by the restricting aperture substrate 206. On the other hand, the multi-beams 20a to 20d not deflected by the collective blanking deflector 212 pass through the center hole of the restricting aperture substrate 206 as shown in FIG. 1. Blanking control is performed by turning ON/OFF of the collective blanking deflector 212, and beam ON/OFF is collectively controlled. In this manner, the restricting aperture substrate 206 shields the multi-beams 20a to 20d deflected so as to be in the beam OFF state, by the collective blanking deflector 212. The multi-beams 20a to 20d are formed by the group of beams formed from the beam ON state till the beam OFF state and having passed through the restricting aperture substrate 206. The multi-beams 20a to 20d having passed through the restricting aperture substrate 206 are focused by the objective lens 207 and become a pattern image (beam diameter) of a desired reduction ratio, and the entire multi-beams 20 having passed the restricting aperture substrate 206 are collectively deflected in the same direction by the main deflector 208 and the sub deflector 209 and emitted to the respective irradiation positions of respective beams on the sample 101. In such a case, the entire multi-beams 20 are collectively deflected by the main deflector 208 so as to respectively irradiate the reference position of a unit inspection area to be scanned by each beam, which will be described later, and also tracking deflection is performed in order to follow the movement of the XY stage 105. Then, the entire multi-beams 20 are collectively deflected by the sub deflector 209 so as to respectively scan the corresponding N×N' sub-areas in the unit inspection area. The multi-beams 20 used for irradiation at one time are ideally arranged at a pitch obtained by multiplying the arrangement pitch L (=ap) of the holes 22 of the shaping aperture array substrate 203 by the above-described desired reduction ratio (1/a). In this manner, the electron beam column 102 irradiates the sample 101 with two-dimensional N×N' multi-beams 20 at a time. Due to irradiation of the multi-beams 20 at a desired position of the sample 101, a flux of secondary electrons (multi-secondary electrons 300) corresponding to respective beams of the multi-beams 20 is released from the sample 101 (see broken lines in FIG. 1 and FIG. 3).

The multi-secondary electrons 300 emitted from the sample 101 are refracted toward the center of the multi-secondary electrons 300 by the objective lens 207 and advance toward the center hole formed in the restricting aperture substrate 206. The multi-secondary electrons 300 that have passed through the restricting aperture substrate 206 are refracted substantially parallel to the optical axis by the reduction lens 205 and advance to the beam separator 214.

Here, the beam separator 214 generates an electric field and a magnetic field in a direction perpendicular to each other on a plane perpendicular to the traveling direction (optical axis) of the multi-beams 20. The electric field exerts a force in the same direction regardless of the traveling direction of electrons. In contrast, the magnetic field exerts a force according to Fleming's left-hand rule. Therefore, the direction of the force acting on electrons can be changed depending on the direction of entrance of electrons. The force due to the electric field and the force due to the magnetic field cancel each other in the multi-beams 20 (primary electron beam) entering the beam separator 214 from the upper side, and the multi-beams 20 go straight downward. On the other hand, in the multi-secondary electrons 300 entering the beam separator 214 from the lower side, the force due to the electric field and the force due to the magnetic field both work in the same direction, and the multi-secondary electrons 300 are bent obliquely upward.

The multi-secondary electrons 300 bent obliquely upward are projected onto the multi-detector 222 while being refracted by the projection lenses 224 and 226. The multi-detector 222 detects the projected multi-secondary electrons 300. The multi-detector 222 has a diode type two-dimensional sensor (not shown). Then, in the diode-type two-dimensional sensor position corresponding to each beam of the multi-beams 20, each secondary electron of the multi-secondary electrons 300 collides with a diode-type two-dimensional sensor to generate electrons, and secondary electrons image data is generated for each pixel to be described later. When the multi-detector 222 does not detect the multi-secondary electrons 300, the multi-secondary electrons 300 may be subjected to blanking deflection by the deflector 228 so that the multi-secondary electrons 300 do not reach the light receiving surface.

Figure 4A:
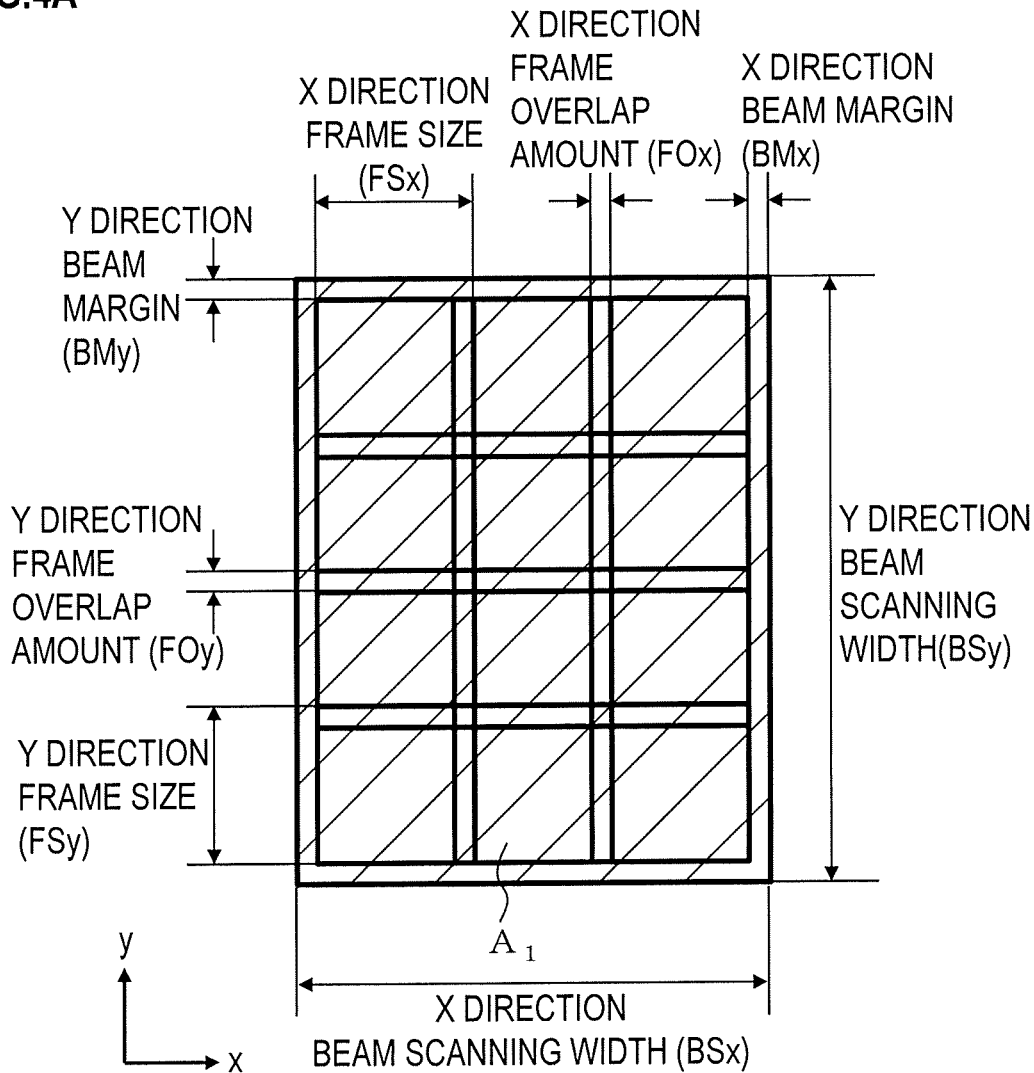
FIGS. 4A and 4B are schematic diagrams for illustrating a first beam scanning area $A_1$ in the first embodiment.
Figure 4B:
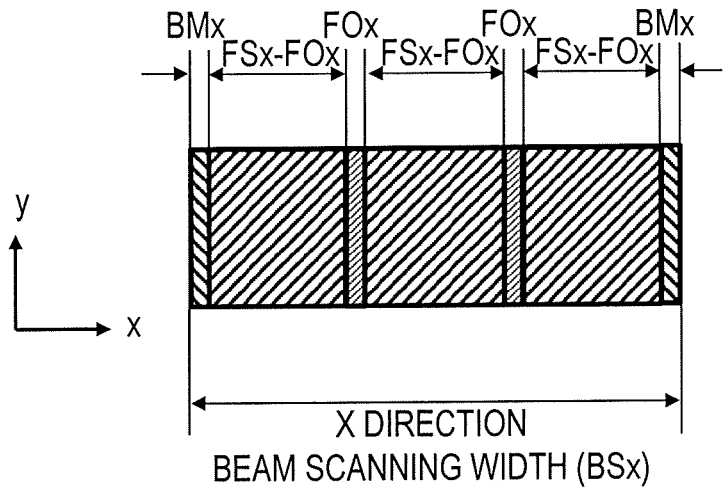

FIGS. 4A and 4B are schematic diagrams for illustrating the first beam scanning area $A_1$ in the present embodiment.

FIG. 4A is a schematic diagram for illustrating the range of the first beam scanning area $A_1$ where the first scanning of the first electron beam is carried out on the sample. FIG. 4B is a diagram illustrating an example of the length of the first beam scanning area $A_1$ in the direction (X direction) of movement of the XY stage 105.

The first electron beam scanning area has a plurality of inspection frames. The term "inspection frame" is an example of "inspection unit". The X direction frame size is $FS_x$ and the Y direction frame size is $FS_y$. In FIGS. 4A and 4B, the shape of each inspection frame is a square satisfying $FS_x = FS_y$. In addition, the sides surrounding each inspection frame, namely the sides of the above-described square is parallel to the X direction or the Y direction, which is the moving direction of the XY stage 105. It should be noted that the shape of each inspection frame can be preferably used for inspection even if the shape is a rectangle satisfying $FS_x \ne FS_y$. When the shape of each inspection frame is rectangular, the long side and the short side of the rectangle described above are parallel to the X direction or the Y direction which is the moving direction of the XY stage 105.

The frames have overlaps (inspection overlap areas) overlapping with each other. The frame overlap amount in the X direction is $FO_x$, and the frame overlap amount in the Y direction is $FO_y$.

The width in the X direction of the first beam scanning area is an X direction beam scanning width $BS_x$. The width in the Y direction of the first beam scanning area is a Y direction beam scanning width $BS_y$. The X direction beam scanning width $BS_x$ is larger than the portion in which the frames are arranged by an X direction beam margin $BM_x$ in the X direction. Further, the Y direction beam scanning width $BS_y$ is larger than the portion in which a plurality of frames are arranged by a Y direction beam margin $BM_y$ in the Y direction.

In other words, the first beam scanning area $A_1$ has a beam margin of the first inspection unit adjacent to the first inspection unit in the direction of movement of the XY stage 105 or in the direction perpendicular to the direction of movement of the XY stage 105.

In the first beam scanning area, the X direction beam scanning width $BS_x$ of the first electron beam is equal to $(FS_x - FO_x) \times n + FO_x + BM_x \times 2$. The number n is an integer, and in the case of FIG. 4A, n=3 is satisfied. Here, the "scanning width" is determined by the balance between the movement amount of the first electron beam and the movement amount of the sample.

The Y direction beam scanning width $BS_y$ of the first electron beam in the first beam scanning area is equal to $(FS_y - FO_y) \times n + FO_y + BM_y \times 2$. The number n is an integer, and in the case of FIG. 4B, n=4 is satisfied.

Figure 5A:
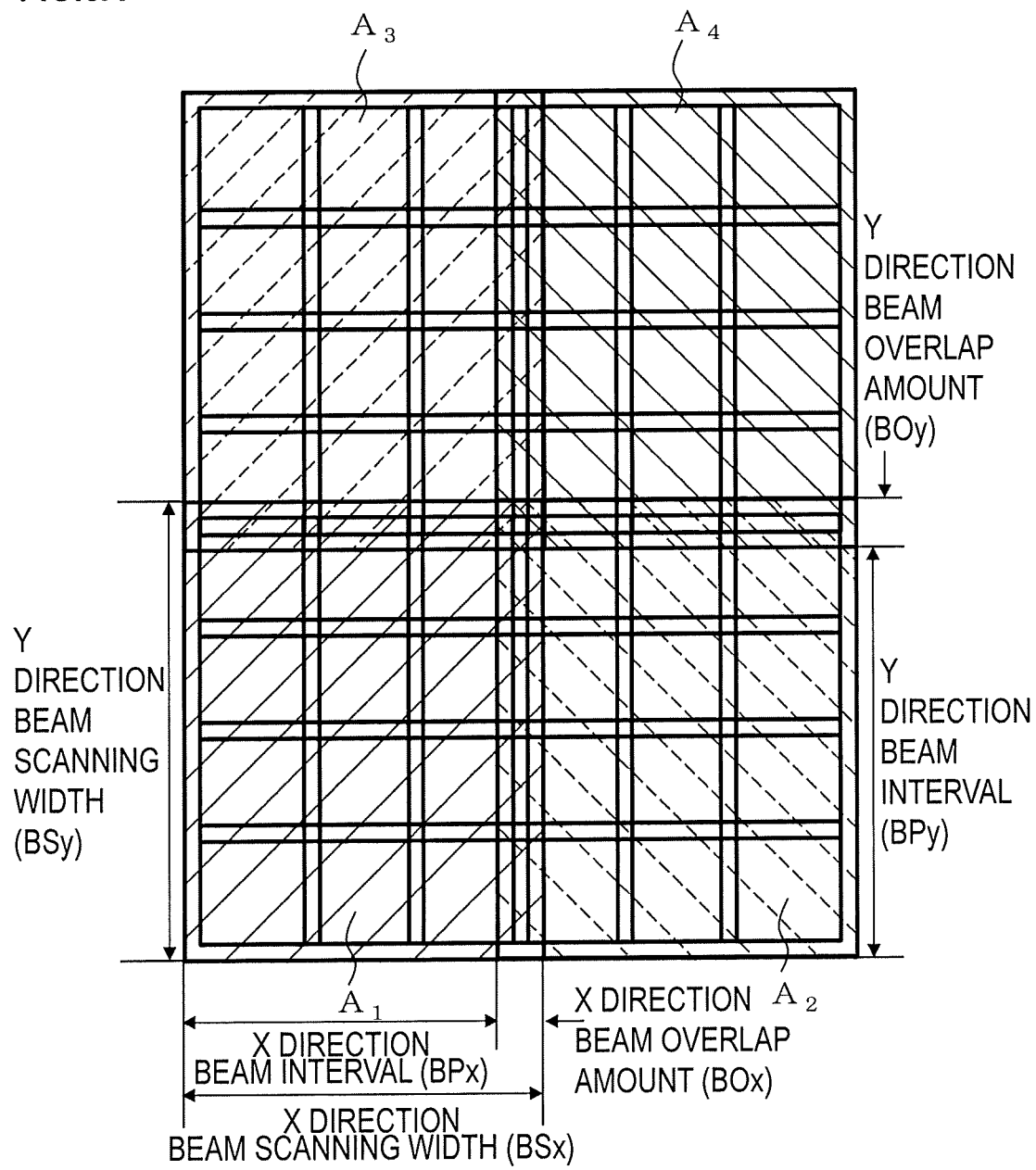
FIGS. 5A and 5B are schematic diagrams showing a first beam scanning area $A_1$, second beam scanning area $A_2$, third beam scanning area $A_3$ and fourth beam scanning area $A_4$ in the first embodiment.
Figure 5B:
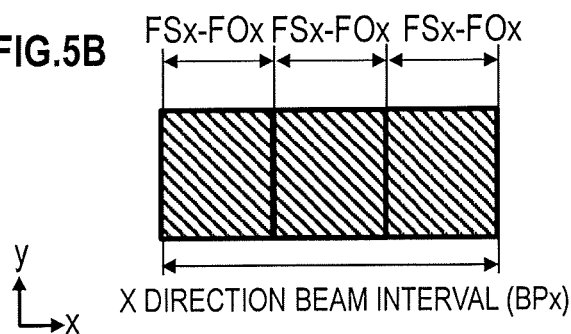

FIGS. 5A and 5B are schematic diagrams showing the first beam scanning area $A_1$, second beam scanning area $A_2$, third beam scanning area $A_3$, and fourth beam scanning area $A_4$ in the present embodiment.

FIG. 5A is a schematic diagram showing the first beam scanning area $A_1$, second beam scanning area $A_2$, third beam scanning area $A_3$, and fourth beam scanning area $A_4$ in the present embodiment. For the first beam scanning area $A_1$, the X direction beam scanning width $BS_x$ and the Y direction beam scanning width $BS_y$ are shown.

FIG. 5B is a schematic diagram for illustrating the X direction beam interval in the present embodiment.

The first beam scanning area $A_1$ is scanned by using the first electron beam. The second beam scanning area $A_2$ is scanned by using the second electron beam. The third beam scanning area $A_3$ is scanned by using the third electron beam. The fourth beam scanning area $A_4$ is scanned by using the fourth electron beam.

The first electron beam and second electron beam, and also the third electron beam and fourth electron beam are respectively disposed apart from each other by an X direction beam interval $BP_x$ in the X direction. The first electron beam and third electron beam, and also the second electron beam and fourth electron beam are respectively disposed apart from each other by a Y direction beam interval $BP_y$. The electron beams are preferably disposed at approximately equal intervals in the X direction or the Y direction.

The first beam scanning area $A_1$ and second beam scanning area $A_2$, and also the third beam scanning area $A_3$ and fourth beam scanning area $A_4$ respectively have beam overlap areas each having an X direction beam overlap amount $BO_x$ in which both overlap each other in the X direction. Further, the first beam scanning area $A_1$ and third beam scanning area $A_3$, and also the second beam scanning area $A_2$ and fourth beam scanning area $A_4$ respectively have beam overlap areas each having a Y direction beam overlap amounts $BO_y$ in which both overlap each other in the Y direction.

In FIG. 5A, the sizes of the first beam scanning area $A_1$, second beam scanning area $A_2$, third beam scanning area $A_3$, and fourth beam scanning area $A_4$ are equal to each other. However, the sizes do not have to be equal.

FIG. 5B is a diagram for illustrating the interval between the first charged particle beam and the second charged particle beam and the length of the first beam scanning area $A_1$ in the direction perpendicular to the moving direction of the XY stage 105 or in the moving direction of the XY stage 105.

The interval $BP_x$ between the first charged particle beam and the second charged particle beam is equal to $(FS_x - FO_x) \times m$. The number m is an integer, and m=3 is satisfied in the case of FIG. 5A.

The interval $BP_y$ between the first charged particle beam and the third charged particle beam is equal to $(FS_y - FO_y) \times m$. The number m is an integer, and m=4 is satisfied in the case of FIG. 5B.

Figure 6:
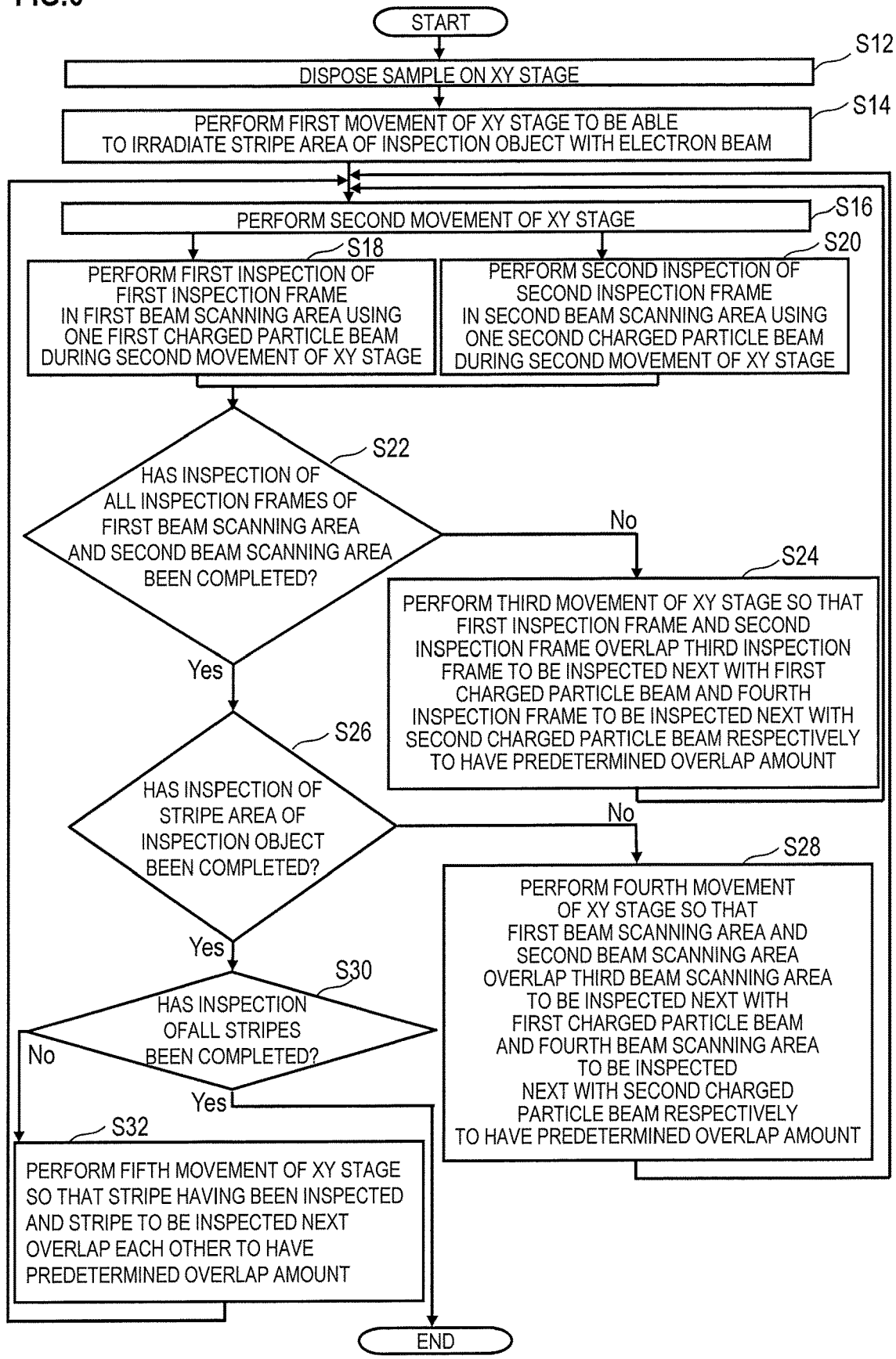
FIG. 6 is a flowchart of a charged particle beam inspection method according to the first embodiment.

FIG. 6 is a flowchart of a charged particle beam inspection method according to the present embodiment.

First, a sample to be inspected is disposed on the XY stage 105 (S12).

Next, a first movement of the XY stage 105 is carried out so that the stripe area to be inspected can be irradiated with a plurality of electron beams (S14).

Here, the stripe area refers to an area where scanning is performed with a plurality of electron beams while the XY stage 105 is continuously moved in the X direction and inspection is performed. In the case where scanning with the electron beam while the XY stage 105 is continuously moved in the Y direction is impossible, one stripe area is inspected while the XY stage 105 is continuously moved in the X direction, and after the inspection, the XY stage 105 is moved in the Y direction so that the stripe area of another inspection object can be inspected by irradiation with an electron beam. After that, another uninspected stripe area is inspected while the XY stage 105 is continuously moved in the X direction or in the direction opposite to the X direction.

Next, a sample is irradiated with multi-beams composed of a plurality of electron beams.

Subsequently, for the inspection in the stripe area, a second movement of the XY stage 105 is performed (S16).

The "second movement of the XY stage 105" is an example of "continuous movement of the XY stage 105 in the X direction".

And then, while the second movement of the XY stage 105 is executed in the X direction, the first scanning of the first inspection frame in the first beam scanning area on the sample is carried out by using one first charged particle beam out of the electron beams. Thus, a first inspection in the first beam scanning area is performed (S18).

At the same time as the first inspection, while the XY stage 105 is continuously moved in the X direction, a second scanning of the second inspection frame in the second beam scanning area on the sample is performed by using one second charged particle beam out of the electron beams. As a result, a second inspection in the second beam scanning area is performed (S20).

Next, it is confirmed whether all the inspection frames in the first beam scanning area and the second beam scanning area have been inspected (S22).

When the inspection of all the inspection frames in the first beam scanning area and the second beam scanning area has not been completed, a third movement of the XY stage is performed so that a first inspection frame and a second inspection frame overlap a third inspection frame to be inspected next with the first charged particle beam and a fourth inspection frame to be inspected next with the second charged particle beam respectively to have overlaps each having a size of the frame overlap amount $FO_x$ in the X direction (S24).

When all the inspection frames in the first beam scanning area and the second beam scanning area have been inspected, it is confirmed whether the inspection of the stripe area to be inspected has been completed (S26).

When the inspection of the stripe area to be inspected has not been completed, a fourth movement of the XY stage is performed so that the first beam scanning area and the second beam scanning area overlap the third beam scanning area to be inspected next with the first charged particle beam and the fourth beam area to be inspected next by the second charged particle beam respectively to have overlaps each having a size of the X direction beam overlap amount $BO_x$ (S28).

When the inspection of the stripe area to be inspected has been completed, it is confirmed whether the inspection of all the stripes has been completed (S30).

When the inspection of the stripe area to be inspected has not been completed, a fifth movement of the XY stage 105 is carried out so that the stripe to be inspected is overlapped with the stripe to be inspected next by Y direction beam overlap amount $BO_y$ (S32).

When all the stripes have been inspected, the inspection is terminated.

The manner of moving the XY stage 105 and the method of beam scanning are not limited to those described above.

Next, the function and effect of the present embodiment will be described.

There is a problem that it is difficult to adjust characteristics such as position and brightness among a plurality of electron beams when a pattern or the like formed on the sample surface is inspected using a plurality of electron beams. Even if the characteristics are adjusted before the inspection, a problem that the characteristics may shift during the inspection exists.

In particular, when one inspection frame is inspected using a plurality of electron beams, the positional shift and the gradation difference exist between the electron beams, so that false defects may occur at the boundary between positions irradiated with respective electron beams.

If the deviation of the characteristics is reproducible, the characteristics can also be corrected in advance. However, the correction is difficult when the characteristic deviation occurs suddenly or during inspection.

In view of this, in the electron beam inspection method of the present embodiment, a sample is disposed on the stage, and, the first scanning of the first beam scanning area on the sample is performed by using one first charged particle beam out of a plurality of charged particle beams, while the stage is moved, so that a first inspection of a first inspection unit in the first beam scanning area is performed and the second scanning of the second beam scanning area on the sample is performed by using one second charged particle beam out of the charged particle beams while the stage is moved so that the second inspection of the second inspection unit in the second beam scanning area is performed.

By doing in this way, images detected by a plurality of electron beams do not coexist in each inspection frame. Therefore, the occurrence of false defects due to differences in characteristics such as positions and brightness among a plurality of electron beams can be suppressed.

Further, in the electron beam inspection method of the present embodiment, a plurality of first inspection frames are provided in the first beam scanning area, and the first inspection frames have inspection overlap areas overlapping each other.

Detecting a defect existing near the boundary of each inspection frame may be sometimes difficult according to a defect detection algorithm. Therefore, inspection overlap areas overlapping each other are provided in the first inspection frames. As a result, even in the case of a defect in the vicinity of the boundary in one of the first inspection frames, the defect may be present near the center of the inspection frame in the other inspection frame. Therefore, defects can be detected with higher accuracy.

Further, in the electron beam inspection method of the present embodiment, a configuration is made so that the first inspection unit has a beam margin around the first inspection unit in the direction of movement or a direction perpendicular to the direction of movement.

In the case of inspection with a plurality of electron beams, even if control is attempted to make the intervals between the respective electron beams equal, it is very difficult to make the intervals completely equal. For this reason, an error (deviation) occurs in the position of the electron beam due to an error (deviation) in the interval between the electron beams. Even when such an error (deviation) occurs, provision of a beam margin enables accurate defect detection at the boundary between the scanning areas of the respective electron beams.

When a length of the first inspection unit in the direction of movement is $FS_x$, a length of the inspection overlap area in the direction of movement is $FO_x$, a length of a beam margin provided adjacent to the first inspection unit in the direction of movement is $BM_x$, and the numbers m and n are integers, a configuration is made so that the interval $BP_x$ between the first charged particle beam and the second charged particle beam is equal to $(FS_x-FO_x) \times m$, and the length $BS_x$ of the first beam scanning area in the direction of movement is $(FS_x-FO_x) \times n + FO_x + BM_x \times 2$, whereby overlapping of the beam scanning areas of each other is reduced, so that charge-up is reduced. Further, since useless beam scanning area is reduced, inspection time can be shortened.

According to the electron beam inspection method of the present embodiment, an electron beam inspection method capable of suppressing erroneous detection of a defect of a sample due to a difference in characteristics between electron beams can be provided.

Second Embodiment

Descriptions of points overlapping with those in the first embodiment are omitted.

Figure 7:
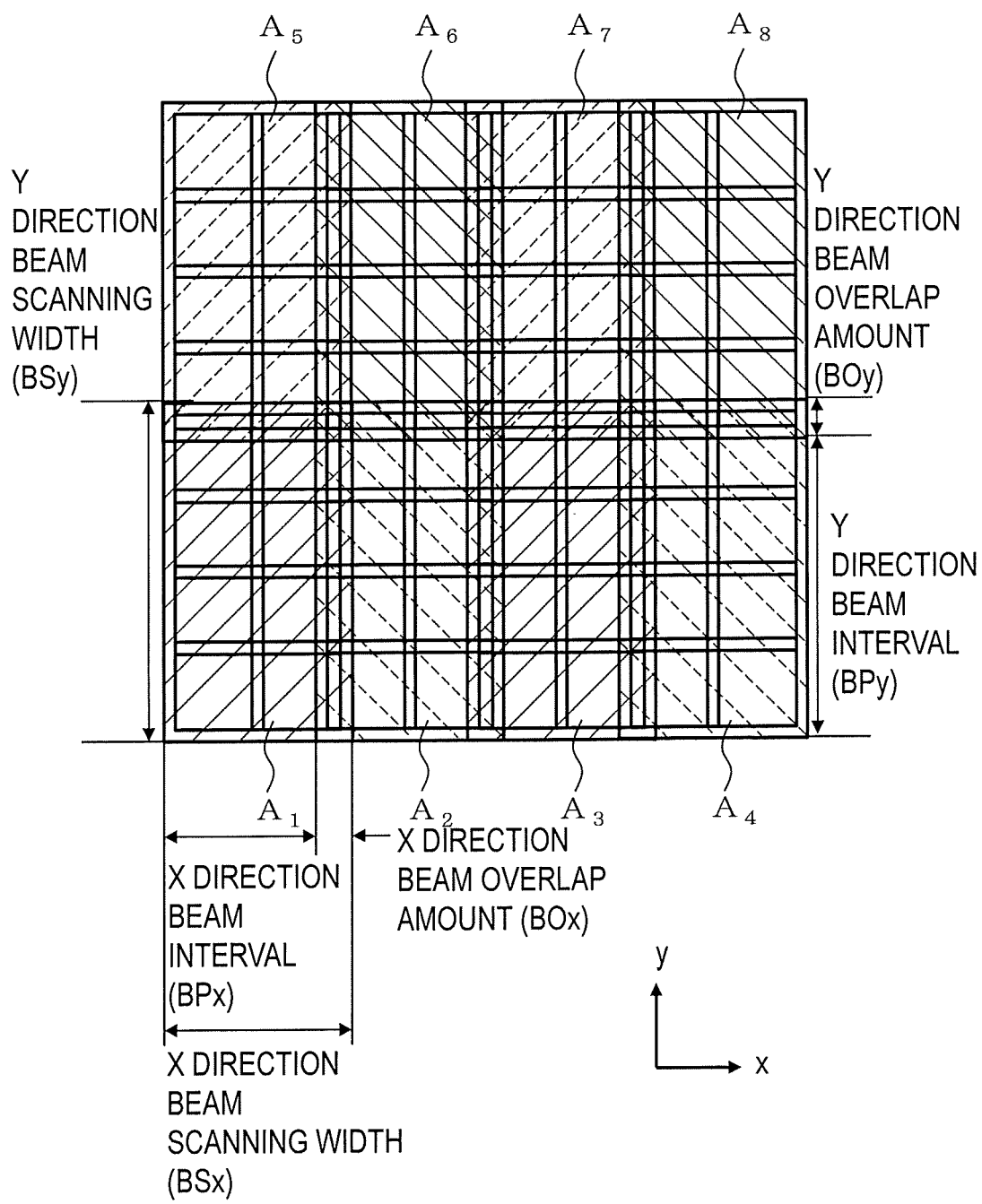
FIG. 7 is a schematic diagram showing a first beam scanning area $A_1$, a second beam scanning area $A_2$, a third beam scanning area $A_3$, a fourth beam scanning area $A_4$, a fifth beam scanning area $A_5$, a sixth beam scanning area $A_6$, a seventh beam scanning area $A_7$, and an eighth beam scanning area $A_8$ in a second embodiment.

FIG. 7 is a schematic diagram showing the first beam scanning area $A_1$, second beam scanning area $A_2$, third beam scanning area $A_3$, fourth beam scanning area $A_4$, fifth beam scanning area $A_5$, sixth beam scanning area $A_6$, seventh beam scanning area $A_7$, and eighth beam scanning area $A_8$ according to the present embodiment.

The first beam scanning area $A_1$ is scanned with one electron beam (first electron beam). The second beam scanning area $A_2$ is scanned with one electron beam (second electron beam). The third beam scanning area $A_3$ is scanned with one electron beam (third electron beam). The fourth beam scanning area $A_4$ is scanned with one electron beam (fourth electron beam). The fifth beam scanning area $A_5$ is scanned with one electron beam (fifth electron beam). The sixth beam scanning area $A_6$ is scanned with one electron beam (sixth electron beam). The seventh beam scanning area $A_7$ is scanned with one electron beam (seventh electron beam). The eighth beam scanning area $A_8$ is scanned with one electron beam (eighth electron beam).

Also with the electron beam inspection method of the present embodiment, an electron beam inspection method capable of suppressing erroneous detection of a defect of a sample due to a difference in characteristics between electron beams can be provided.

Third Embodiment

The electron beam inspection method of the present embodiment is different from the first embodiment or the second embodiment in that the sides surrounding each inspection frame in each beam scanning area are not parallel to the direction perpendicular to the direction of movement of the XY stage 105 or the direction of movement of the XY stage 105. Here, the description overlapping with the first embodiment or the second embodiment is omitted.

Figure 8:
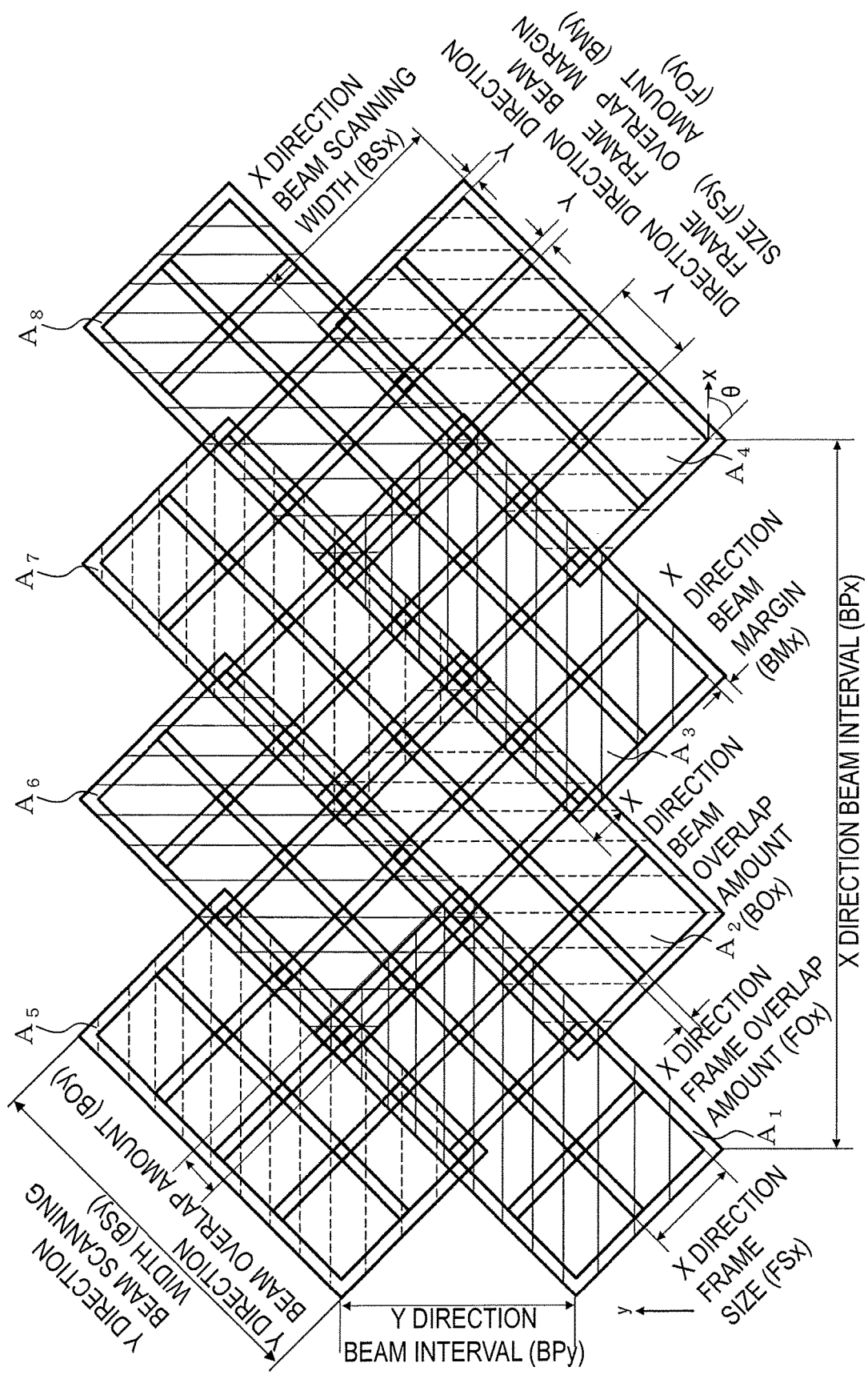
FIG. 8 is a schematic diagram showing a first beam scanning area $A_1$, a second beam scanning area $A_2$, a third beam scanning area $A_3$, a fourth beam scanning area $A_4$, a fifth beam scanning area $A_5$, a sixth beam scanning area $A_4$, a seventh beam scanning area $A_7$, and an eighth beam scanning area $A_8$ in a third embodiment.

FIG. 8 is a schematic diagram showing the first beam scanning area $A_1$, second beam scanning area $A_2$, third beam scanning area $A_3$, fourth beam scanning area $A_4$, fifth beam scanning area $A_5$, sixth beam scanning area $A_6$, seventh beam scanning area $A_7$, and eighth beam scanning area $A_8$ according to the present embodiment.

In FIG. 8, each beam scanning area has a rectangular shape. Each side of the rectangle described above deviates by a deviation angle of 45 degrees from the X direction or the Y direction, which is the moving direction of the XY stage 105.

The shape of each inspection frame in each beam scanning area is a square satisfying $FS_x=FS_y$. The sides that surround this inspection frame, namely the above-mentioned square sides deviate by a deviation angle of 45 degrees from the X direction or the Y direction, which is the moving direction of the XY stage 105. It should be noted that the shape of each inspection frame can be preferably used for inspection even if the shape is a rectangle satisfying $FS_x \ne FS_y$. When the shape of each inspection frame is rectangular, the long side and the short side of the rectangle deviate by a deviation angle of 45 degrees from the X direction or the Y direction, which is the moving direction of the XY stage 105.

The deviation angle $\theta$ of the sides surrounding the inspection frame from the movement direction of the XY stage 105 is preferably between 35 degrees and 55 degrees inclusive, and more preferably between 40 degrees and 50 degrees inclusive. When patterns are inspected with an electron beam, the edge of the pattern often shines intensely. In particular, when the edge of the pattern is disposed perpendicular to the moving direction of the XY stage, the edge shines strongly. If the edge is too shiny, there is a possibility that detection of defects of the pattern may be hindered. Since the edge of the normal pattern is formed parallel or perpendicular to the predetermined orientation of the sample, it is possible to prevent the edge of the pattern from shining too strongly and to detect a defect easily by setting the side for surrounding the inspection frame at the above angle.

The first beam scanning area $A_1$ is scanned with one electron beam (first electron beam). The second beam scanning area $A_2$ is scanned with one electron beam (second electron beam). The third beam scanning area $A_3$ is scanned with one electron beam (third electron beam). The fourth beam scanning area $A_4$ is scanned with one electron beam (fourth electron beam). The fifth beam scanning area $A_5$ is scanned with one electron beam (fifth electron beam). The sixth beam scanning area $A_6$ is scanned with one electron beam (sixth electron beam). The seventh beam scanning area $A_7$ is scanned with one electron beam (seventh electron beam). The eighth beam scanning area $A_8$ is scanned with one electron beam (eighth electron beam).

Assuming that the length of a first side out of the sides surrounding the first inspection unit is $FS_x$, the length of a second side parallel to the first side, out of the sides surrounding the inspection overlap area is $FO_x$, the length of a third side parallel to the first side, of the beam margin provided adjacent to the first inspection unit is $BM_x$, the deviation angle of the first side from the direction of movement (X direction) is $\theta$, and the numbers m and n are integers, the interval $BP_x$ between the first electron beam and the second electron beam is preferably $(FS_x-FO_x) \times m/\cos\theta$. Further, the length of the first beam scanning area in the direction of movement is preferably $((FS_x-FO_x) \times n+FO_x+BM_x \times 2)/\cos\theta$.

Further, assuming that the length of the first side out of the sides surrounding the first inspection unit is $FS_y$, the length of the second side parallel to the first side, out of the sides surrounding the inspection overlap area is $FO_y$, the length of the third side parallel to the first side, of the beam margin provided adjacent to first inspection unit is $BM_y$, the deviation angle of the first side from the direction of movement (Y direction) is $\theta$, and the numbers m and n are integers, the interval $BP_y$ between the first electron beam and the second electron beam is preferably $(FS_y-FO_y) \times m/\cos\theta$. Also, the length of the first beam scanning area in the direction of movement is preferably $((FS_y-FO_y) \times n+FO_y+BM_y \times 2)/\cos\theta$.

In the above description, a series of " . . . circuit" includes a processing circuit, which includes an electric circuit, a computer, a processor, a circuit board, a quantum circuit, a semiconductor device, or the like. In addition, a common processing circuit (same processing circuit) may be used for each " . . . circuit". Alternatively, different processing circuits (separate processing circuits) may be used. A program for executing a processor or the like may be recorded on a recording medium such as a magnetic disk device, a magnetic tape device, an FD, or a read only memory (ROM).

The embodiments of the present disclosure have been described with reference to specific examples. The above embodiments are merely given as examples and do not restrict the present disclosure. Further, the constituents of each embodiment may be appropriately combined.

In the embodiments, descriptions of parts which are not directly necessary for the description of the present disclosure such as the structure of the charged particle beam inspection method and the method for manufacturing the charged particle beam are omitted, but the required configuration of the charged particle beam inspection method can be appropriately selected to be used. In addition, all the charged particle beam inspection methods that include the elements of the present disclosure and can be appropriately designed and changed by those skilled in the art are included in the scope of the present disclosure. The scope of the present disclosure is defined by the scope of the claims and the scope of equivalents of the claims.

What is claimed is:

1. A charged particle beam inspection method comprising:
    disposing a sample on a stage;
    performing a first inspection of a first inspection unit in a first beam scanning area by performing a first scanning of the first beam scanning area on the sample by using one first charged particle beam out of a plurality of charged particle beams while executing movement of the stage; and
    performing a second inspection of a second inspection unit in a second beam scanning area by performing a second scanning of the second beam scanning area on the sample by using one second charged particle beam out of the charged particle beams while executing movement of the stage,
    wherein a plurality of the first inspection units are provided in the first beam scanning area, and the first inspection units have inspection overlap areas overlapping each other, and
    when a length of the first inspection unit in a direction of the movement is $FS_x$, a length of the inspection overlap areas in a direction of the movement is $FO_x$, a length of a beam margin provided adjacent to the first inspection unit in the direction of the movement is $BM_x$, and numbers m and n are integers,
    an interval $BP_x$ between the first charged particle beam and the second charged particle beam is equal to $(FS_x-FO_x) \times m$, and
    a length $BS_x$ of the first beam scanning area in a direction of the movement is equal to $(FS_x-FO_x) \times n + FO_x + BM_x \times 2$.

2. The charged particle beam inspection method according to claim 1, wherein
    a plurality of the first inspection units are provided in the first beam scanning area, and
    the first inspection units have inspection overlap areas overlapping each other.

3. The charged particle beam inspection method according to claim 1, wherein
    the first beam scanning area has a beam margin of the first inspection unit adjacent to the first inspection unit in a direction of the movement.

4. The charged particle beam inspection method according to claim 1, wherein
    the first beam scanning area and the second beam scanning area have beam overlap areas overlapping each other.

5. The charged particle beam inspection method according to claim 1, wherein
    a size of the first beam scanning area and a size of the second beam scanning area are equal to each other.

6. The charged particle beam inspection method according to claim 1, wherein
    at least one of the sides that surround the first inspection unit is parallel to a direction of the movement.

7. The charged particle beam inspection method according to claim 6, wherein
    a shape of the first inspection unit is rectangular.

8. The charged particle beam inspection method according to claim 6, wherein
    a shape of the first inspection unit is square.

9. The charged particle beam inspection method according to claim 1, wherein
    at least one of the sides that surround the first inspection unit is not parallel to a direction of the movement.

10. A charged particle beam inspection method comprising:
    disposing a sample on a stage;
    performing a first inspection of a first inspection unit in a first beam scanning area by performing a first scanning of the first beam scanning area on the sample by using one first charged particle beam out of a plurality of charged particle beams while executing movement of the stage; and
    performing a second inspection of a second inspection unit in a second beam scanning area by performing a second scanning of the second beam scanning area on the sample by using one second charged particle beam out of the charged particle beams while executing movement of the stage, wherein
    a plurality of the first inspection units are provided in the first beam scanning area, and the first inspection units have inspection overlap areas overlapping each other, and
    when a length of a first side of sides surrounding the first inspection unit is $FS_x$, a length of a second side parallel to the first side, among sides surrounding the inspection overlap areas is $FO_x$, a length of a third side parallel to the first side, of a beam margin provided adjacent to the first inspection unit is $BM_x$, an angle of deviation of the first side from a direction of the movement is $\theta$, and numbers m and n are integers,
    an interval $BP_x$ between the first charged particle beam and the second charged particle beam is $(FS_x-FO_x) \times m/\cos \theta$, and
    a length of the first beam scanning area in a direction of the movement is $((FS_x-FO_x) \times n + FO_x + BM_x \times 2)/\cos \theta$.

11. A charged particle beam inspection method comprising:
    disposing a sample on a stage;
    performing a first inspection of a first inspection unit in a first beam scanning area by performing a first scanning of the first beam scanning area on the sample by using one first charged particle beam out of a plurality of charged particle beams while executing movement of the stage; and
    performing a second inspection of a second inspection unit in a second beam scanning area by performing a second scanning of the second beam scanning area on the sample by using one second charged particle beam out of the charged particle beams while executing movement of the stage, wherein
    wherein the first beam scanning area has a beam margin of the first inspection unit adjacent to the first inspection unit in a direction of the movement, the first charged particle beam is scanned in the beam margin, and the beam margin is disposed outside of the first inspection unit.

12. The charged particle beam inspection method according to claim 11, wherein
a plurality of the first inspection units are provided in the first beam scanning area, and
the first inspection units have inspection overlap areas overlapping each other.

13. The charged particle beam inspection method according to claim 11, wherein
the first beam scanning area and the second beam scanning area have beam overlap areas overlapping each other.

14. The charged particle beam inspection method according to claim 11, wherein
a size of the first beam scanning area and a size of the second beam scanning area are equal to each other.

15. The charged particle beam inspection method according to claim 11, wherein
at least one of the sides that surround the first inspection unit is parallel to a direction of the movement.

16. The charged particle beam inspection method according to claim 11, wherein
a shape of the first inspection unit is rectangular.

17. The charged particle beam inspection method according to claim 11, wherein
a shape of the first inspection unit is square.

18. The charged particle beam inspection method according to claim 11, wherein
at least one of the sides that surround the first inspection unit is not parallel to a direction of the movement.

* * * * *